United States Patent
Baek et al.

(10) Patent No.: US 6,781,849 B2
(45) Date of Patent: Aug. 24, 2004

(54) MULTI-CHIP PACKAGE HAVING IMPROVED HEAT SPREAD CHARACTERISTICS AND METHOD FOR MANUFACTURING THE SAME

(75) Inventors: Joong-hyun Baek, Kyungki-do (KR); Tae-koo Lee, Kyungki-do (KR); Min-ha Kim, Chungcheongnam-do (KR); Yun-hyeok Im, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/410,011

(22) Filed: Apr. 7, 2003

(65) Prior Publication Data

US 2003/0210533 A1 Nov. 13, 2003

(30) Foreign Application Priority Data

May 9, 2002 (KR) .............................. 10-2002-0025626

(51) Int. Cl.[7] .............................................. H05K 7/10
(52) U.S. Cl. ..................... 361/760; 361/720; 361/748; 361/736; 257/777; 257/686; 174/52.4; 29/827; 29/593
(58) Field of Search ................................. 361/760, 720, 361/736, 748, 790; 257/777, 686; 174/52.4, 260; 29/827, 593, 840; 438/15, 123

(56) References Cited

U.S. PATENT DOCUMENTS

| | | | | |
|---|---|---|---|---|
| 5,864,177 A | * | 1/1999 | Sundstrom | 257/723 |
| 6,072,243 A | * | 6/2000 | Nakanishi | 257/783 |
| 6,307,256 B1 | * | 10/2001 | Chiang et al. | 257/668 |
| 6,414,391 B1 | * | 7/2002 | Corisis et al. | 257/738 |
| 6,555,902 B2 | * | 4/2003 | Lo et al. | 257/686 |
| 6,593,662 B1 | * | 7/2003 | Pu et al. | 257/777 |

* cited by examiner

Primary Examiner—David Martin
Assistant Examiner—Hung S. Bui
(74) Attorney, Agent, or Firm—Marger Johnson & McCollom, P.C.

(57) ABSTRACT

A multi-chip package (MCP) in which heat generated in first and second chips of the MCP is spread effectively and a method for manufacturing the same. The MCP includes first and second chips. The MCP further comprises a tape including a conductive material layer therein situated between the first chip and the second chip. Thus, the heat generated in the second chip can effectively spread to the outside through the tape.

24 Claims, 6 Drawing Sheets

MULTI-CHIP PACKAGE HAVING IMPROVED HEAT SPREAD CHARACTERISTICS AND METHOD FOR MANUFACTURING THE SAME

This application claims priority from Korean Patent Application No. 2002-25626, filed May 9, 2002, the disclosure of which is incorporated herein by reference in its entirety.

BACKGROUND OF THE INVENTION

1. Field of the Invention

The present invention relates to a semiconductor device, and more particularly, to a multi-chip package (MCP) and a method for manufacturing the same.

2. Description of the Related Art

The multi-chip packages (MCPs) including multiple semiconductor chips have been utilized to produce miniaturized and lightweight electronic products with low manufacturing costs and high reliability.

In forming MCPs, the same or different types of multiple semiconductor chips can be included in a single semiconductor package. When the same types of chips are included in a single semiconductor package, in the case of semiconductor memory devices, MCPs have been particularly employed to increase integration of the semiconductor memory devices.

Figure 1:
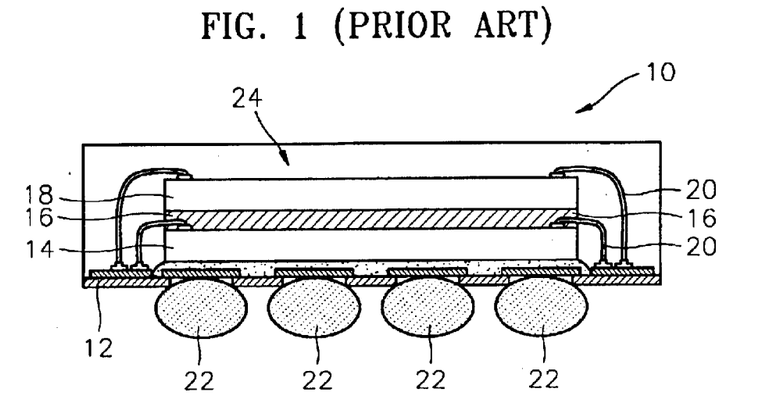
FIG. 1 is a cross-sectional view of a conventional multi-chip package (MCP)

FIG. 1 is a cross-sectional view of a conventional multi-chip package (MCP). Referring to FIG. 1, in a conventional MCP 10, the same types of chips are included in a single semiconductor package. In particular, a first chip 14 is attached to a substrate 12, and a second chip 18 is attached to the first chip 14 using a spacer adhesive 16. Subsequently, the MCP 10 is sealed with an epoxy-molding compound (EMC) 24. Reference numeral 20 denotes a gold wire by which a bond pad of the first and second chips 14 and 18 is connected to a bond finger of the substrate 12, and reference numeral 22 denotes a solder ball used as an external connection terminal of the MCP 10.

However, in the conventional MCP 10, heat generated in the second chip 18 is trapped in the spacer adhesive 16. Thus, the heat generated in the second chip 18 is not smoothly spread to the substrate 12 and the solder ball 22 because a heat transfer passage is blocked in the spacer adhesive 16.

The conventional MCP 10 has the following problems. Namely, if the first and second chips 14 and 18 are a highly-integrated memory device operating at high speed, and the electronic devices on which the MCP 10 is mounted are used for miniaturized electronic products such as mobile phones, the refresh characteristics can be degraded by an increase in the temperature of the MCP 10. Also, the operating speed of the MCP 10 can be decreased and the life time of the MCP 10 can be reduced.

SUMMARY OF THE INVENTION

To solve the above problems, the present invention provides a multi-chip package (MCP) having improved heat spread characteristics, in which heat generated in a chip is not trapped and is smoothly spread and thus the thermal performance of the MCP is improved.

The present invention also provides a method for manufacturing a MCP having improved heat spread characteristics.

According to an embodiment of the present invention, a MCP includes a package substrate including bond fingers formed on a first set of opposite sides thereof. A first chip is attached to the substrate and includes first bond pads formed adjacent the bond fingers of the substrate. A tape is attached to the first chip and the tape includes a conductive material layer or metal core layer therein. A second chip is attached to the tape and the second chip includes second bond pads formed adjacent the bond fingers of the substrate. The bond pads of the first and second chips are electrically connected to the bond fingers of the substrate.

According to another embodiment of the present invention, a method for manufacturing a multi-chip package (MCP) having improved heat spread characteristics is provided.

A package substrate is provided. The package substrate includes bond fingers formed on a first set of opposite sides thereof. The package substrate further includes a ground bonding portion formed on a second set of opposite sides of thereof. A first chip is attached to the substrate. A tape is attached to the first chip. The tape includes a conductive material layer or a core metal layer. And bond pads of the first chip are electrically connected to the bond fingers of the substrate.

With embodiments of the present invention, the heat generated in the second chip can be effectively spread through the heat transfer passage, such as the ground bonding portion, the substrate, and the external connection terminals, through the tape including the conductive material layer having high heat transfer characteristics. Thus, the thermal performance of the MCP can be significantly improved compared to the prior art.

BRIEF DESCRIPTION OF THE DRAWINGS

The above objectives and advantages of the present invention will become more apparent by describing in detail preferred embodiments thereof with reference to the attached drawings in which.

DETAILED DESCRIPTION OF THE INVENTION

The present invention will be described more fully hereinafter with reference to the accompanying drawings in which preferred embodiments of the invention are shown. This invention may, however, be embodied in many different forms and should not be construed as being limited to the embodiments set forth herein. Rather, these embodiments are provided so that this disclosure will be thorough and complete and will fully convey the scope of the invention to those skilled in the art.

Figure 2:
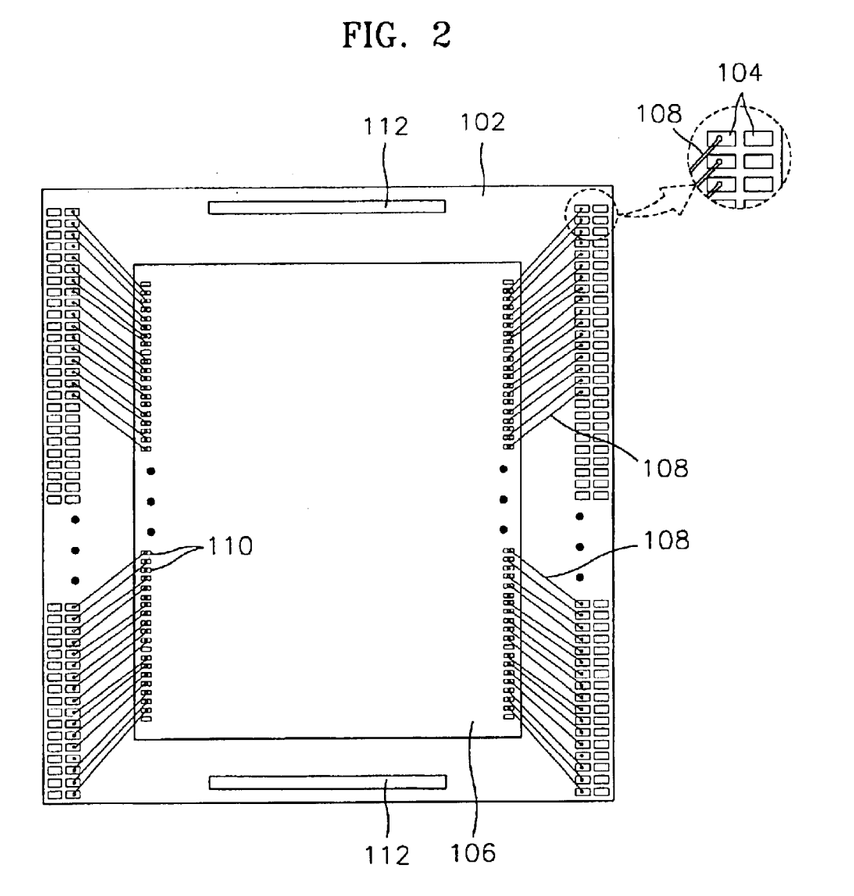
FIGS. 2 through 8 illustrate a method for manufacturing a MCP having improved heat spread characteristics according to an embodiment of the present invention.

FIGS. 2 through 8 illustrate a method for manufacturing a MCP having improved heat spread characteristics according to an embodiment of the present invention. FIG. 2 is a plan view in which a first chip 106 is attached to a substrate 102 using an adhesive, and then a wire bonding process is performed such that a bond finger 104 of the substrate 102 is connected to a bond pad 110 of the first chip 106 using a first wire 108 such as a gold wire. The substrate 102 is a typical conventional substrate for a ball grid array (BGA) package. One skilled in the art will appreciate that any other suitable substrates can be used within the spirit and scope of the present invention. The substrate 102 includes a ground bonding portion 112, to which a tape, i.e., a continuous narrow, flexible strip (116 of FIG. 3) including a core metal layer or a conductive material layer therein is attached.

The ground bonding portion 112 is formed on a side of the substrate 102, in which there are no bond fingers 104. Preferably, the height of the first gold wire 108 is as low as possible during the wire bonding process to prevent the first gold wire 108 from contacting the backside of a second chip (120 of FIG. 4) when the tape is attached to the first chip 106 and then the second chip is attached to the first chip 106.

Figure 3:
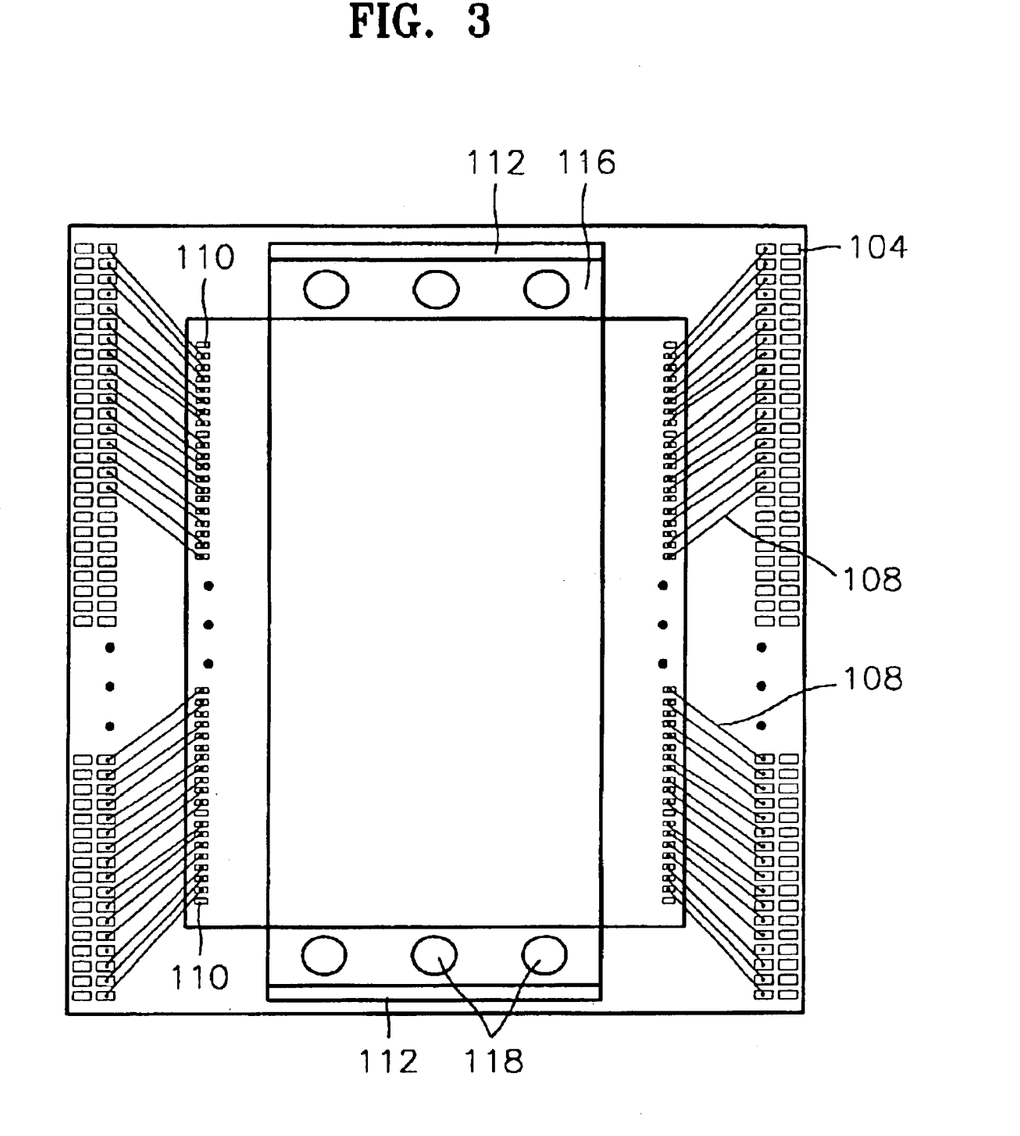

FIG. 3 is a plan view in which the tape 116 is attached to substrate 102 to which the first wire 108 is attached. The tape 116 covers the surface of the first chip 106, excluding an area of the bond pad 110 of the first chip 106. Both ends of the tape 116 are preferably attached to the ground bonding portion 112 of the substrate 102. Thus, the tape 116 extends from an edge of the first chip 106 and attaches to the surface of the substrate 102 including the ground bonding portion 112. Preferably, the tape 116 runs along a center axis of the first chip 106.

A molding improving hole 118 is preferably formed near both ends of the tape 116 to improve the molding property of an epoxy molding compound (EMC) in a subsequent molding process. Since the EMC can flow through the molding improving hole 118, the formation of a void in the molding improving hole 118 can be prevented.

The method for manufacturing a MCP including the above process of attaching the tape 116 may be modified within the spirit and scope of the present invention. Specifically, the wire bonding process is first performed to the first chip 106, and then the tape 116 is attached to the resultant structure on which the wire bonding process using the first wire 108 has been completed, but in a reverse order, the tape 116 may first be attached to the first chip 110, and then the wire bonding process may be performed using the first wire 108.

Figure 4:
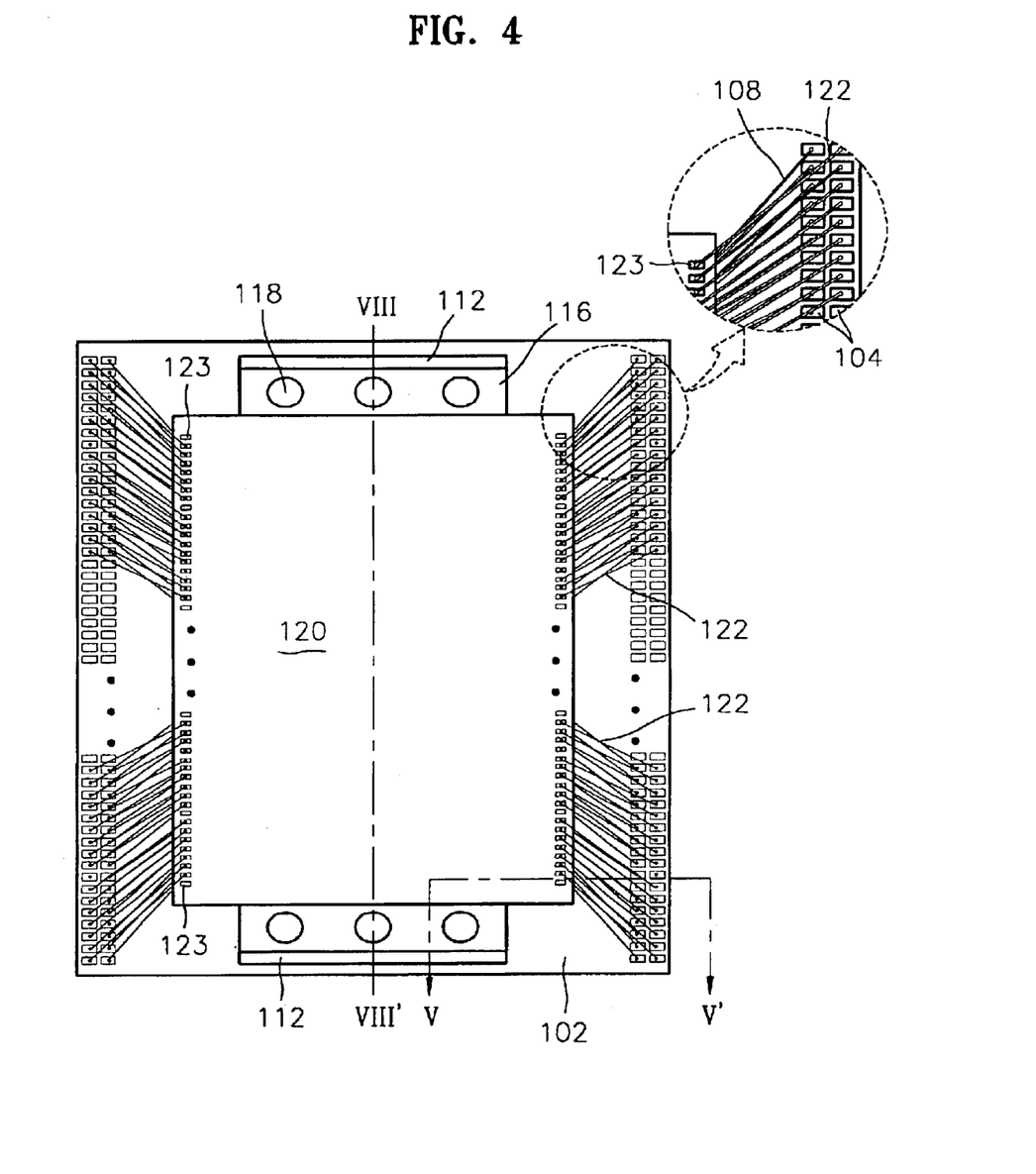

FIG. 4 is a plan view in which the second chip 120 is attached to the resultant structure to which the tape 116 is attached and then a wire bonding is performed using a second wire 122. The second chip 120 preferably has the same function as that of the first chip 106, and thus a bond pad of the second chip 120 is preferably formed in the same position as in the bond pad 110 of the first chip 106. If the height of the first wire (108 of FIG. 2) is smaller than that of the tape 116, contact of the first wire with the backside of the second chip 120 can be prevented.

Figure 5:
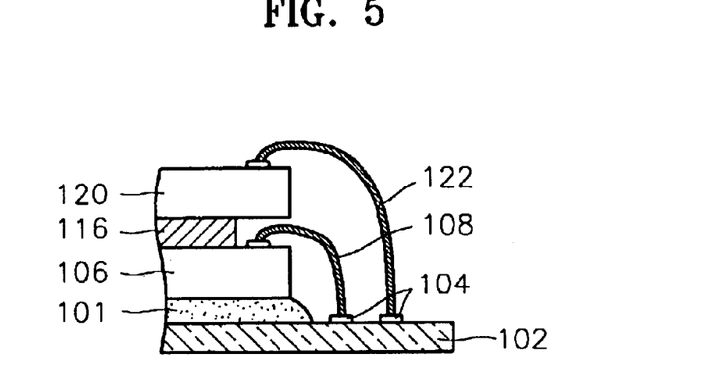

FIG. 5 is a cross-sectional view taken along line V–V' of FIG. 4. Referring to FIG. 5, the first chip 106 is attached to the substrate 102 using an adhesive 101, and the second chip 120 is attached to the first chip 106 using the tape 116. The first wire 108 preferably does not contact the backside of the second chip 120. The bond finger 104 of the first wire 108 is separated from the bond finger 104 of the second wire 122.

Figure 6:
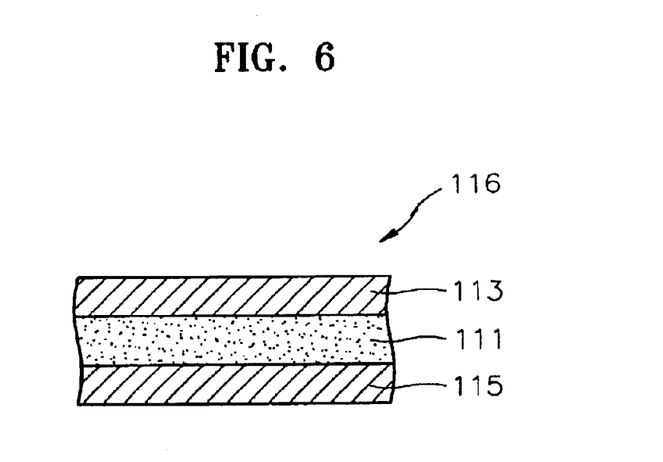
Figure 7:
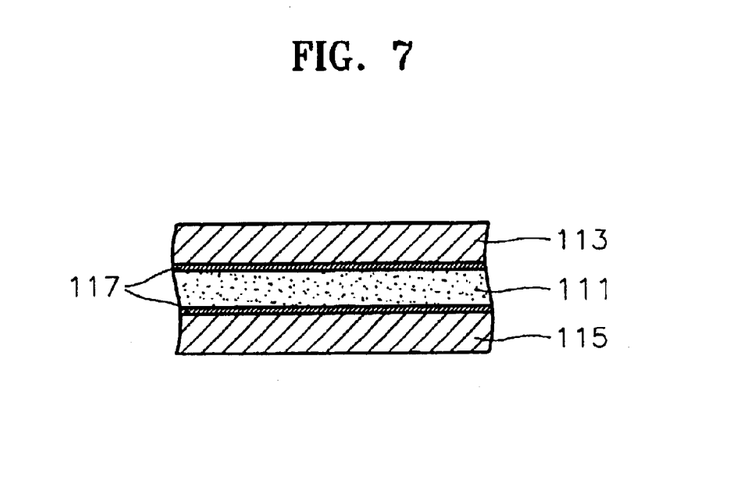

FIG. 6 is a cross-sectional view of the tape 116, and FIG. 7 is a cross-sectional view of the tape 116 according to another embodiment of the present invention. Referring to FIGS. 6 and 7, the tape 116 is comprised of a first adhesive layer 113, a metal core or a conductive material layer 111, and a second adhesive layer 115. The first and second adhesive layers 113 and 115 are conductive adhesive layers including conductive materials such as silver (Ag) particles and may be formed using an adhesive tape or liquid adhesive and each have a thickness of about 5–50 µm. The metal core layer 111 may be at least one of an aluminum layer, a copper layer, and a multilayer including the copper layer, all having a high heat conductivity. It is preferable that the metal core layer 111 have a thickness of about 50–120 µm.

As shown in FIG. 7, the metal core layer 111 may be a multilayer in which a heat transfer improving layer 117 is deposited on the copper layer. Preferably, the heat transfer improving layer 117 is a carbon layer formed on the copper layer by, for example, chemical vapor deposition (CVD) or a composite layer including carbon. Since the heat transfer capability of the heat transfer improving layer 117 is higher than that of the copper layer, the MCP 100 according to an embodiment of the present invention has a structure through which heat generated in the second chip 120 is spread more smoothly.

Figure 8:
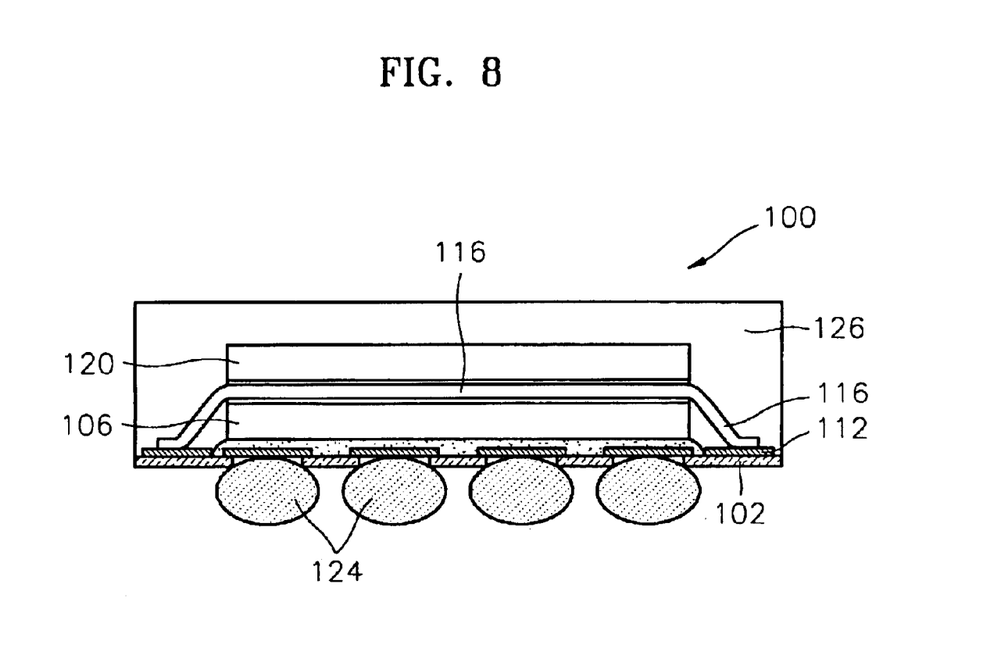

FIG. 8 is a cross-sectional view, taken along line VII-I–VIII' of FIG. 4, in which the resultant structure of FIG. 4 is molded using an EMC 126, and then an external connection terminal such as a solder ball 124 is attached to the bottom portion of the substrate 102. In comparison with the prior art, the first chip 106 is attached to the second chip 120 using the tape 116 including the conductive material layer 111, instead of a spacer adhesive. Because a molding improving hole (not shown) is formed in the tape 116, during a molding process, the EMC 126 can easily flow between the substrate 102 and the tape 116. Thus, the formation of a void in the EMC 126 is prevented.

Figure 9:
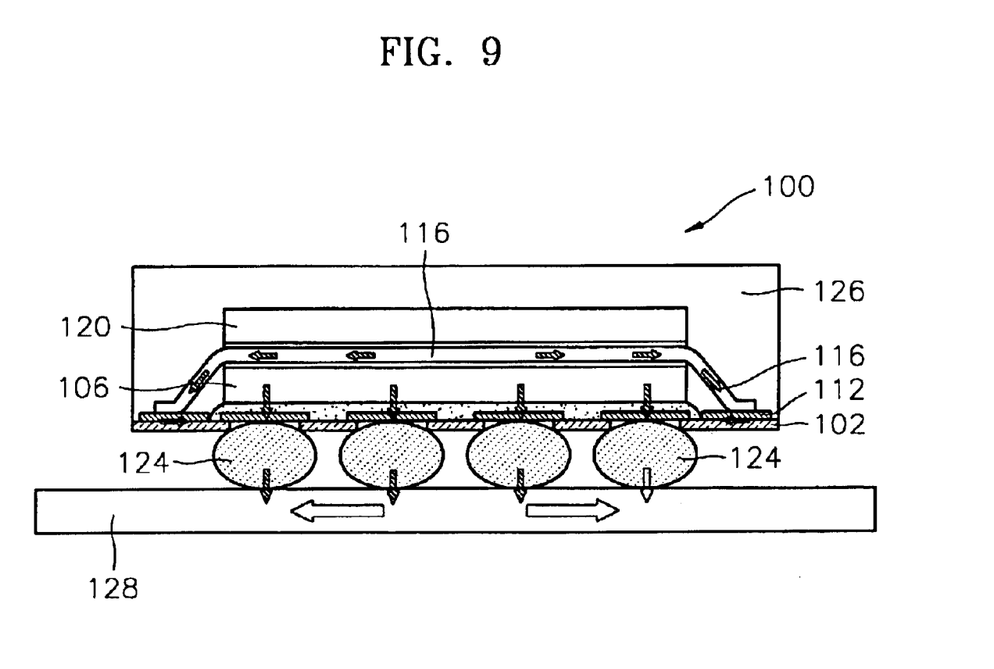
FIG. 9 is a cross-sectional view explaining the effect of the present invention.

FIG. 9 is a cross-sectional view explaining the effect of the present invention. Referring to FIG. 9, the tape 116 interposed between the first chip 106 and the second chip 120 serves as a heat transfer passage by which the heat spread capability of the second chip 120 is improved. That is, the heat generated in the second chip 120 flowing in a direction shown by the arrows in FIG. 9, is spread more effectively to a printed circuit board (PCB) 128 on which the MCP 100 is mounted, to a ground bonding portion (not shown) of the substrate 102, and to the solder ball 124 through the tape 116. Accordingly, the heat generated in the second chip 120 is not trapped in the first chip 106, and the problems of the prior art related to heat being trapped therein are prevented.

FIRST MODIFIED EXAMPLE

Figure 10:
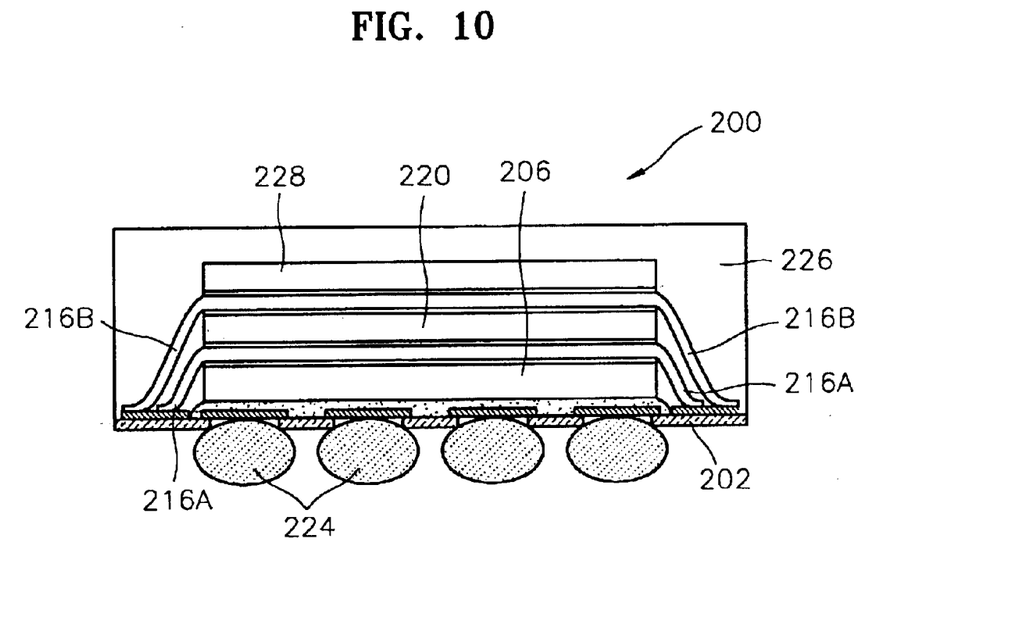
FIG. 10 is a cross-sectional view illustrating a first modified example of a MCP having improved heat spread characteristics according to the present invention.

FIG. 10 is a cross-sectional view illustrating a first modified example of a MCP having improved heat spread characteristics according to an embodiment of the present invention. Referring to FIG. 10, three chips 206, 220, and 228 are sequentially mounted on a MCP 200 using tapes 216A and 216B each including a conductive material layer. Reference numerals corresponding to those of the above-described embodiment are the same as and have the same or similar functions as those of the above described embodiment, and thus their descriptions will not be repeated.

SECOND MODIFIED EXAMPLE

Figure 11:
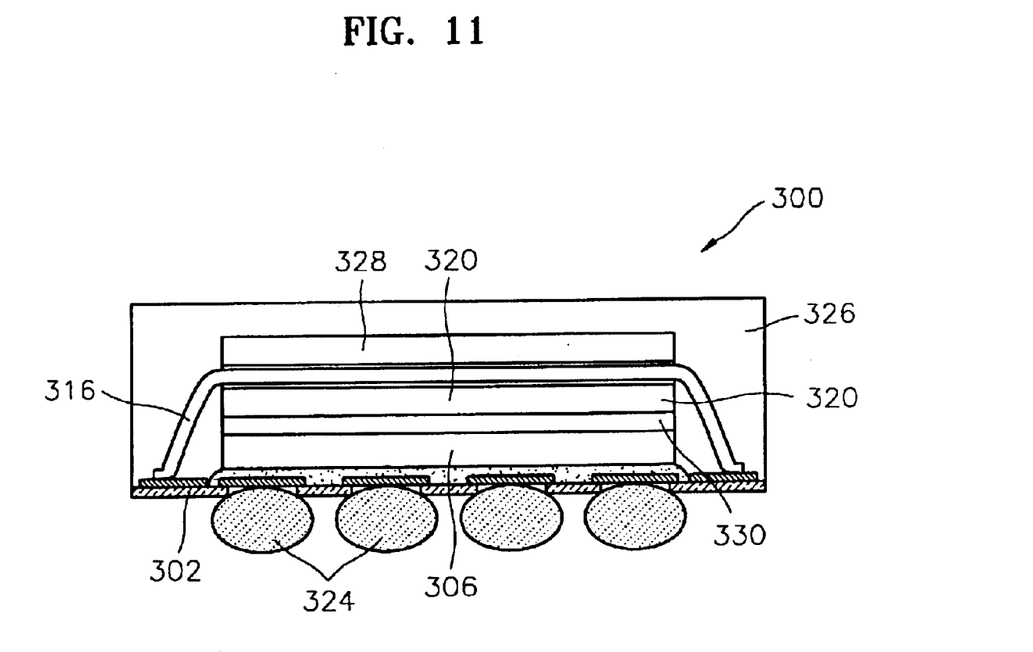
FIG. 11 is a cross-sectional view illustrating a second modified example of a MCP having improved heat spread characteristics according to the present invention.

FIG. 11 is a cross-sectional view illustrating a second modified example of a MCP having improved heat spread characteristics according to another embodiment of the present invention. Referring to FIG. 11, three chips 306, 320, and 328 are sequentially mounted on a MCP 300 using a spacer adhesive layer 330 and a tape 316. The spacer adhesive layer 330 is disposed between the first chip 306 and the second chip 320. The tape 316 is disposed between the second chip 320 and the third chip 328, which have the lowest heat spread characteristics. Reference numerals corresponding to those of the above embodiment are the same as and have the same or similar functions as those of the above embodiment, and thus their descriptions will not be repeated.

As described above, the heat generated in the second chip can be spread to the heat transfer passage, such as the ground bonding portion, the substrate, and the external connection terminal, through the tape including a conductive material layer having high heat transfer characteristics, thereby improving the thermal performance of the MCP.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A multi-chip package (MCP) comprising:
   a package substrate including bond fingers formed on a first set of opposite sides thereof,
   a first chip overlying the substrate, the first chip including first bond pads formed adjacent the bond fingers of the substrate;
   a flexible tape attached to the first chip, the tape including a conductive material layer therein; and
   a second chip attached the tape, the second chip including second bond pads formed adjacent the bond fingers of the substrate,
   wherein the bond pads of the first and second chips are electrically connected to the bond fingers of the substrate,
   wherein the tape extends from an edge of the first chip and attaches to the surface of the substrate to spread heat generated in the second chip through the tape. thereby improving the thermal performance of MCP.

2. The MCP of claim 1, further comprising an epoxy molding compound (EMC) covering the first chip, the tape, and the second chip.

3. The MCP of claim 1, further comprising a ground bonding portion on a second set of opposite sides of the substrate, the ground bonding portion coupled to the tape.

4. The MCP of claim 1, wherein a conductive wire electrically connects the bond pads of the first and second chips the bond finger of the substrate.

5. The MCP of claim 1, wherein the package substrate is a ball grid array (BGA) substrate.

6. The MCP of claim 1, wherein the bond fingers includes a first set of bond fingers for the first chip and a second set of bond fingers for the second chip.

7. The MCP of claim 1, wherein the tape is attached to the surface of the first chip excluding an area of the bond pads.

8. The MCP of claim 1, wherein the tape includes a first adhesive layer, the conductive material layer, and a second adhesive layer, which are sequentially stacked.

9. The MCP of claim 8, wherein the first and second adhesive layers include conductive particles to improve heat spread.

10. The MCP of claim 9, wherein the particles are silver (Ag) particles.

11. The of claim 8, wherein the conductive material layer is at least one selected from an aluminum layer, a copper layer, and a composite layer including the copper layer and a heat transfer improving layer formed on the copper layer.

12. The MCP of claim 11, wherein the heat transfer improving layer is a carbon layer or composite layer including carbon.

13. The MCP of claim 8, wherein the first and second adhesive layers each have a thickness of about 5–50 μm.

14. The MCP of claim 8, wherein the conductive material layer has a thickness of about 50–120 μm.

15. The MCP of claim 1, wherein the tape includes a molding improving hole therein to alleviate thermal stress and to improve a molding property in a molding process.

16. The MCP of claim 1, further comprising an external connection terminal attached to a lower portion of the substrate.

17. The MCP of claim 1, wherein the tape runs along a center axis of the first chip.

18. The MCP of claim 1, wherein the first chip is attached to the substrate through an adhesive.

19. The MCP of claim 1, further comprising an additional chip disposed between the first chip and the substrate.

20. The MCP of claim 19, wherein the additional chip is coupled to the first chip using an adhesive.

21. The MCP of claim 20, further comprising an additional tape including a conductive material layer between the additional chip and the first chip.

22. The MCP of claim 22, wherein the additional tape extends from an edge of the additional chip and attaches to the ground bonding portion.

23. A multi-chip package (MCP) comprising:
   a package substrate including bond fingers formed on a first set of opposite sides thereof,
   a first chip overlying the substrate, the first chip including first bond pads formed adjacent the bond fingers of the substrate;
   a tape attached to the first chip, the tape including a conductive material layer therein; and
   a second chip attached to the tape, the second chip including second bond pads formed adjacent the bond fingers of the substrate, wherein the bond pads of the first and second chips are electrically connected to the bond fingers of the substrate, and wherein the tape includes a molding improving hole therein to alleviate thermal stress and to improve a molding property in a molding process.

24. A multi-chip package (MCP) comprising:
   a package substrate including bond fingers formed on a first set of opposite sides thereof,
   a first chip overlying the substrate, the first chip including first bond pads formed adjacent the bond fingers of the substrate;
   a tape attached to the first chip, the tape including a conductive material layer therein; and
   a second chip attached to the tape, the second chip including second bond pads formed adjacent the bond fingers of the substrate, wherein the bond pads of the first and second chips are electrically connected to the bond fingers of the substrate, and wherein the additional tape extends from an edge of the additional chip and attaches to the ground bonding portion.

* * * * *

UNITED STATES PATENT AND TRADEMARK OFFICE
CERTIFICATE OF CORRECTION

PATENT NO. : 6,781,849 B2  Page 1 of 1
APPLICATION NO. : 10/410011
DATED : August 24, 2004
INVENTOR(S) : Baek et al.

It is certified that error appears in the above-identified patent and that said Letters Patent is hereby corrected as shown below:

Column 5, line 40, "second chin through the tape. thereby" should read --second chip through the tape, thereby--.

Column 6, line 1, "The of claim 8," should read --The MCP of claim 8,--.

Column 6, line 26, "of claim 20, further" should read --of claim 19, further--.

Column 6, line 29, "of claim 22, wherein" should read --of claim 21, wherein--.

Signed and Sealed this

First Day of April, 2008

JON W. DUDAS
*Director of the United States Patent and Trademark Office*